(12) United States Patent
Hshieh

(10) Patent No.: US 7,929,321 B2
(45) Date of Patent: Apr. 19, 2011

(54) DEPLETION MODE TRENCH MOSFET FOR IMPROVED EFFICIENCY OF DC/DC CONVERTER APPLICATIONS

(75) Inventor: Fwu-Iuan Hshieh, Saratoga, CA (US)

(73) Assignee: Force-Mos Technology Corp (KY)

( * ) Notice: Subject to any disclaimer, the term of this patent is extended or adjusted under 35 U.S.C. 154(b) by 80 days.

(21) Appl. No.: 12/229,470

(22) Filed: Aug. 22, 2008

(65) Prior Publication Data

US 2010/0044796 A1    Feb. 25, 2010

(51) Int. Cl.
*H02M 3/335*    (2006.01)
*H01L 29/66*    (2006.01)

(52) U.S. Cl. .......... 363/25; 257/341; 257/365; 257/368; 257/371; 257/E21.473; 363/23; 438/524

(58) Field of Classification Search .................. 257/341, 257/365, 368, 371; 363/22–26
See application file for complete search history.

(56) References Cited

U.S. PATENT DOCUMENTS

| | | | | |
|---|---|---|---|---|
| 6,096,596 A | * | 8/2000 | Gonzalez | 438/239 |
| 2002/0134999 A1 | * | 9/2002 | Hirokawa et al. | 257/258 |
| 2006/0154423 A1 | * | 7/2006 | Fried et al. | 438/283 |
| 2007/0111428 A1 | * | 5/2007 | Enicks et al. | 438/235 |
| 2007/0195563 A1 | * | 8/2007 | Shiraishi et al. | 363/25 |
| 2007/0238429 A1 | * | 10/2007 | Song et al. | 455/222 |

\* cited by examiner

*Primary Examiner* — Howard Weiss
*Assistant Examiner* — Raj Gupta
(74) *Attorney, Agent, or Firm* — Bo-In Lin

(57) ABSTRACT

A DC-to-DC converter includes a high-side transistor and a low-side transistor wherein the high-side transistor is implemented with a high-side enhancement mode MOSFET. The low side-transistor further includes a low-side enhancement MOSFET shunted with a depletion mode transistor having a gate shorted to a source of the low-side enhancement mode MOSFET. A current transmitting in the DC-to-DC converter within a time-period between T2 and T3 passes through a channel region of the depletion mode MOSFET instead of a built-in diode D2 of the low-side MOSFET transistor. The depletion mode MOSFET further includes trench gates surrounded by body regions with channel regions immediately adjacent to vertical sidewalls of the trench gates wherein the channel regions formed as depletion mode channel regions by dopant ions having electrical conductivity type opposite from a conductivity type of the body regions.

20 Claims, 15 Drawing Sheets

DEPLETION MODE TRENCH MOSFET FOR IMPROVED EFFICIENCY OF DC/DC CONVERTER APPLICATIONS

BACKGROUND OF THE INVENTION

1. Field of the Invention

The invention relates generally to the device configuration and manufacturing methods for fabricating the semiconductor power devices for more efficient DC/DC converter applications. More particularly, this invention relates to an improved and novel manufacturing process and device configuration for providing the MOSFET device with depletion mode channel regions for combining with an enhancement mode MOSFET device to improve the operation efficiency of the DC/DC converters.

2. Description of the Related Art

The electronic devices applied for carrying out a function of DC-to-DC conversion are still confronted with a difficulty that the devices implemented with an enhancement mode MOSFET are limited by a problem of increased power dissipation. Specifically, an increase of power dissipation may occur in a DC-DC converter implemented with a circuit shown in FIG. 1A as disclosed in U.S. Pat. No. 6,593,620. FIG. 1B is a timing diagram for showing the control signals GDS1 and GDS 2 for driving the switches S1 and S2 respectively at times T1, T2 and T3, T4. A current passes through the built-in body diode D2 of the enhancement mode MOSFET within the time period between T2 and T3 will cause a voltage drop about 0.7 volts and thus increasing the power dissipation.

For the purpose of resolving these difficulties, FIG. 1C shows another circuit implemented to transmit the current within the time period between T2 and T3 through a Schottky rectifier instead of the built in diode. FIG. 1B shows a DC/DC converter implemented with an enhancement mode MOSFET for the high side and an enhancement mode MOSFET shunt with a Schottky diode rectifier for the low side. The voltage drop is reduced to about 0.4 volts. In comparison the converter shown in FIG. 1A, the power dissipation is significantly reduced. However, the circuit of FIG. 1B encounters another problem because such circuit has a high reverse leakage current.

Therefore, a need still exists in the art of power semiconductor device design and manufacture to provide new manufacturing method and device configuration in forming the semiconductor power devices such that the above discussed problems and limitations can be resolved.

SUMMARY OF THE PRESENT INVENTION

It is therefore an aspect of the present invention to provide a new and improved semiconductor power device as a depletion mode MOSFETs as shown in FIG. 3 having a plurality of trench gates surrounded by body regions encompassing source regions therein to replace the Schottky rectifier in FIG. 1C. The depletion mode MOSFET further includes a channel region adjacent to the trench gates by an ion implant of an optimized source dopant to provide free chare carries in the channel regions for low forward voltage drop (Vf) and lower reverse leakage current Ir than Schottky rectifier when the gate-source voltage is zero. The reverse leakage current can be further reduced when the gates are negatively biased. In comparison with the enhancement mode trench MOSFET as shown in 1D has no charge carriers in the channel when the gate-source voltage is zero. When the gate-source voltage is positively biased, the current flows from the drain to the source through the channel by forming an inversion region.

It is another aspect of the present invention to provide a new and improved DC-DC converter by combining a enhancement mode MOSFET and a depletion mode MOSFET in the low-side of the DC-DC converter with the depletion mode MOSFET reducing both forward voltage drop Vf and the reverse current Ir when the gate in the low side is zero biased relatively to source to improve the efficiency of the converter such that the above discussed difficulties and limitations of the convention power semiconductor devices can be resolved.

Another aspect of the present invention is to provide a new and improved semiconductor power device as a depletion mode MOSFET having a plurality of trench gates surrounded by body regions encompassing source regions therein. The depletion mode MOSFET further includes a channel region adjacent to the trench gates by an ion implant of a source dopant of arsenic ions to provide free chare carries in the channel regions.

Another aspect of the present invention is to provide a new and improved semiconductor power device as a depletion mode MOSFET having a plurality of trench gates surrounded by body regions encompassing source regions therein. The depletion mode MOSFET further includes a channel region adjacent to the trench gates by an ion implant of positive cesium ions to provide free chare carries in the channel regions.

Another aspect of the present invention is to provide a new and improved semiconductor power device as a depletion mode MOSFET having a plurality of trench gates surrounded by body regions encompassing source regions therein. The depletion mode MOSFET further includes a channel region adjacent to the trench gates by forming a second epitaxial layer surrounding the trench gate with the second epitaxial layer doped with a source dopant such as a silicon or a SiGe epitaxial layer doped with a source dopant to provide free chare carries in the channel regions.

Briefly in a preferred embodiment, this invention discloses a DC-to-DC converter includes a high-side transistor and a low-side transistor wherein the high-side transistor is implemented with a high-side enhancement mode MOSFET. The low side-transistor further includes a low-side enhancement MOSFET shunted with a depletion mode transistor having a gate shorted to a source of the low-side enhancement mode MOSFET. In an exemplary embodiment, a current transmitting in the DC-to-DC converter within a time-period between T2 and T3 passes through a channel region of the depletion mode MOSFET instead of a built-in diode D2 of the low-side MOSFET transistor. In another exemplary embodiment, the depletion mode MOSFET combined with the low-side enhancement mode MOSFET and the high-side MOSFET transistor are manufactured simultaneously with compatible manufacturing processes. In another exemplary embodiment, the depletion mode MOSFET integrated with the low-side enhancement mode MOSFET and the high-side MOSFET transistor are manufactured simultaneously with compatible manufacturing processes and disposed on one semiconductor substrate for packaging as an integrated circuit (IC) chip. In another exemplary embodiment, the depletion mode MOSFET further includes trench gates surrounded by body regions with channel regions immediately adjacent to vertical sidewalls of the trench gates wherein the channel regions formed as depletion mode channel regions by dopant ions having electrical conductivity type opposite from a conductivity type of the body regions. In another exemplary embodiment, the depletion mode MOSFET further includes trench gates surrounded by body regions of P-type conductivity having channel regions immediately adjacent to vertical sidewalls of the trench gates wherein the channel regions formed as depletion mode channel regions by dopant ions having a N-type conductivity. In another exemplary embodiment, the depletion mode MOSFET further includes trench gates surrounded by body regions of P-type conductivity having channel regions immediately adjacent to vertical sidewalls of the trench gates wherein the channel regions are depletion mode channel regions implanted with arsenic (As) dopant ions. In another exemplary embodiment, the depletion mode MOSFET further includes trench gates surrounded by body regions of P-type conductivity having channel regions immediately adjacent to vertical sidewalls of the trench gates wherein the channel regions are depletion mode channel regions implanted with Cesium (Cs) dopant ions. In another exemplary embodiment, the depletion mode MOSFET further includes trench gates surrounded by body regions of P-type conductivity having channel regions immediately adjacent to vertical sidewalls of the trench gates wherein the channel regions are depletion mode channel regions N-type silicon epitaxial layer surrounding the trench gates. In another exemplary embodiment, the depletion mode MOSFET further includes trench gates surrounded by body regions of P-type conductivity having channel regions immediately adjacent to vertical sidewalls of the trench gates wherein the channel regions are depletion mode channel regions N-type SiGe epitaxial layer surrounding the trench gates. In another exemplary embodiment, the depletion mode MOSFET further includes trench gates surrounded by body regions with channel regions immediately adjacent to vertical sidewalls of the trench gates wherein the channel regions are formed as depletion mode channel regions by dopant ions having electrical conductivity type opposite from a conductivity type of the body regions. And, the trench gates are electrically shorted to source regions of the depletion mode MOSFET via a gate contact metal contacting to a source metal of the low-side depletion mode MOSFET.

Furthermore, this invention discloses a method to manufacture a depletion mode MOSFET simultaneously with an enhancement mode MOSFET. The method includes a step of shorting a gate of the depletion mode MOSFET to a source of the enhancement mode MOSFET for implementing the depletion mode MOSFET as a shunt for the enhancement mode MOSFET. In an exemplary embodiment, the step of manufacturing the depletion mode MOSFET simultaneously with the enhancement mode MOSFET further includes steps of applying compatible manufacturing processes on one semiconductor substrate for packaging the depletion mode MOSFET and the enhancement mode MOSFET as an integrated circuit (IC) chip. In another exemplary embodiment, the step of manufacturing the depletion mode MOSFET further includes a step of forming depletion mode channel regions immediately adjacent to vertical sidewalls of the trench gates by implanting dopant ions having electrical conductivity type opposite from a conductivity type of body regions of the depletion mode MOSFET.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 8A to 8D and FIGS. 8B-2 and 8A-2 are a serried of cross sectional views for showing the processing steps for making the depletion mode MOSFET device as that implemented in FIG. 2 and FIGS. 3 to 7.

DETAILED DESCRIPTION OF THE METHOD

Figure 1A:
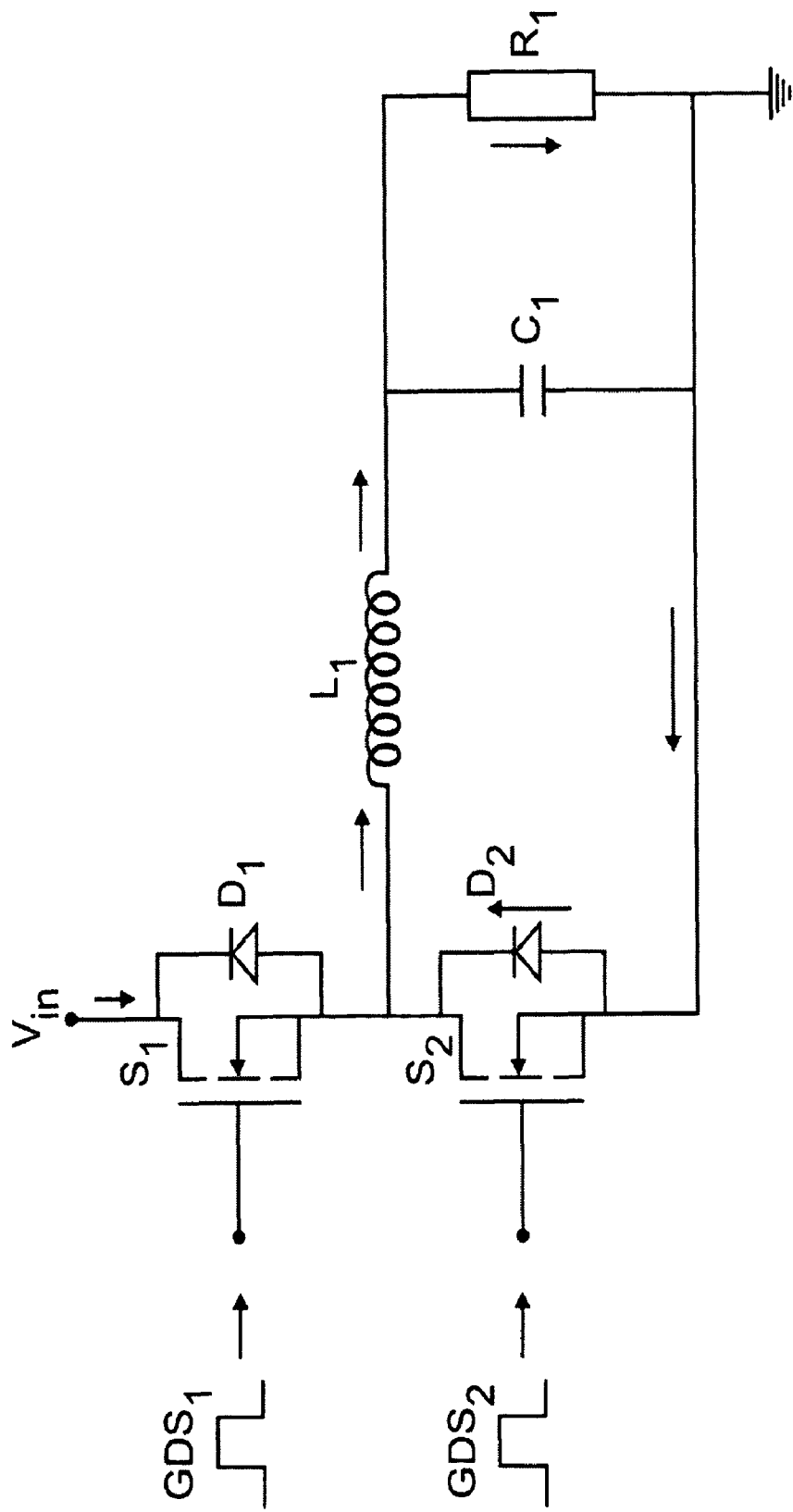
FIG. 1A is a circuit diagram for showing a convention DC/DC converter implemented with enhancement mode MOSFET for both high and low sides.
Figure 1B:
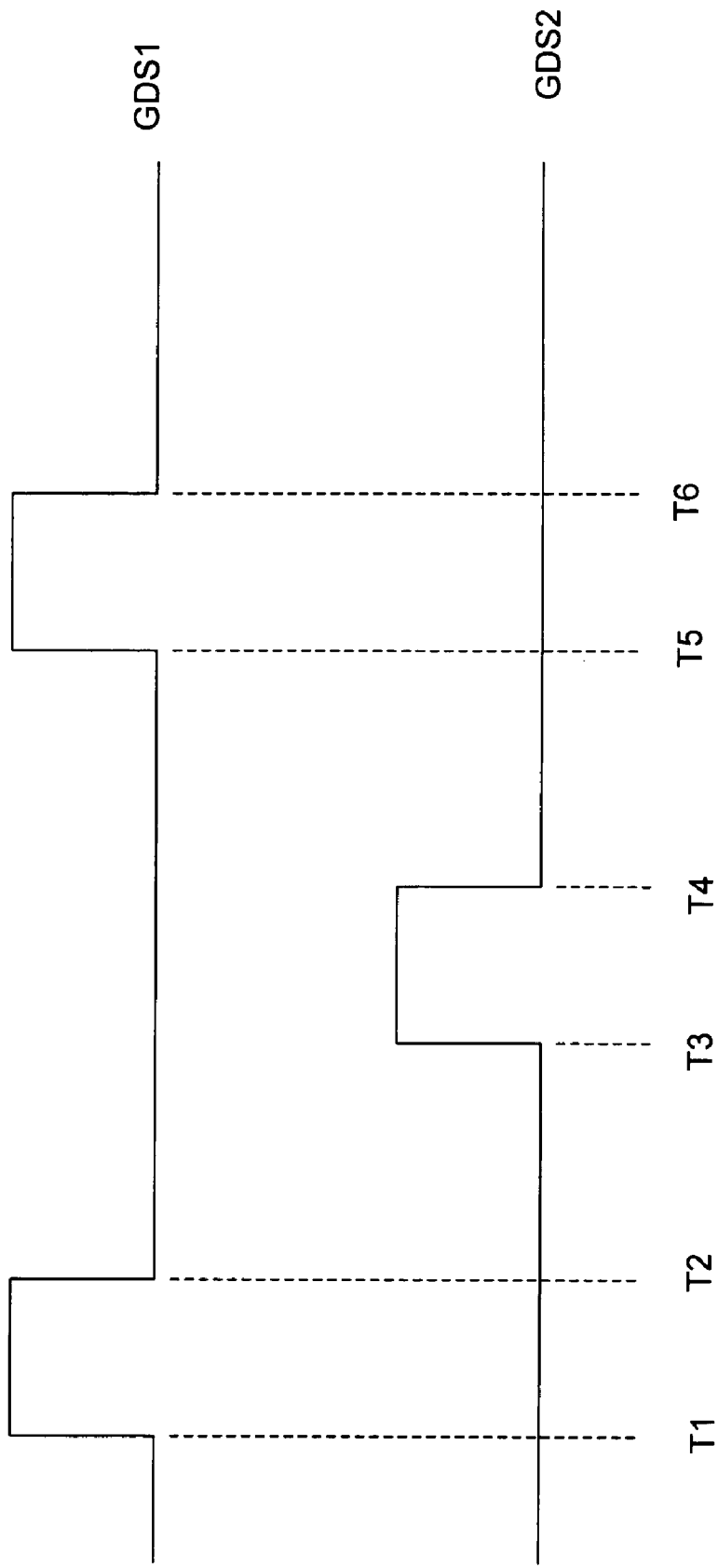
FIG. 1B is a timing diagram for shown the control signals for driving switches of the DC/DC converter of FIG. 1A at different times.
Figure 1C:
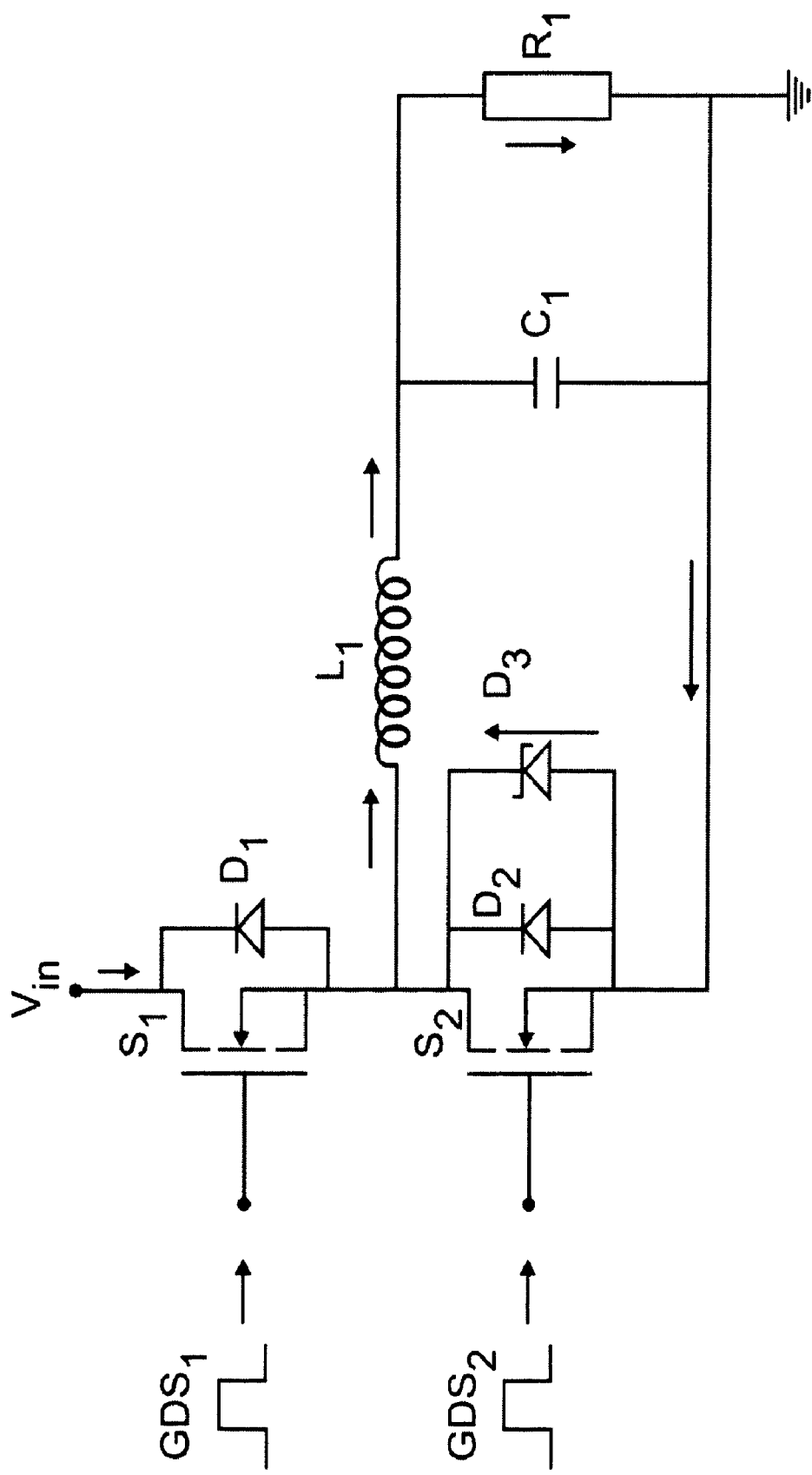
FIG. 1C is circuit diagram for another DC/DC converter implemented with enhancement mode MOSFET for high side and enhancement mode MOSFET shunt with Schottky rectifier for the low side.
Figure 2:
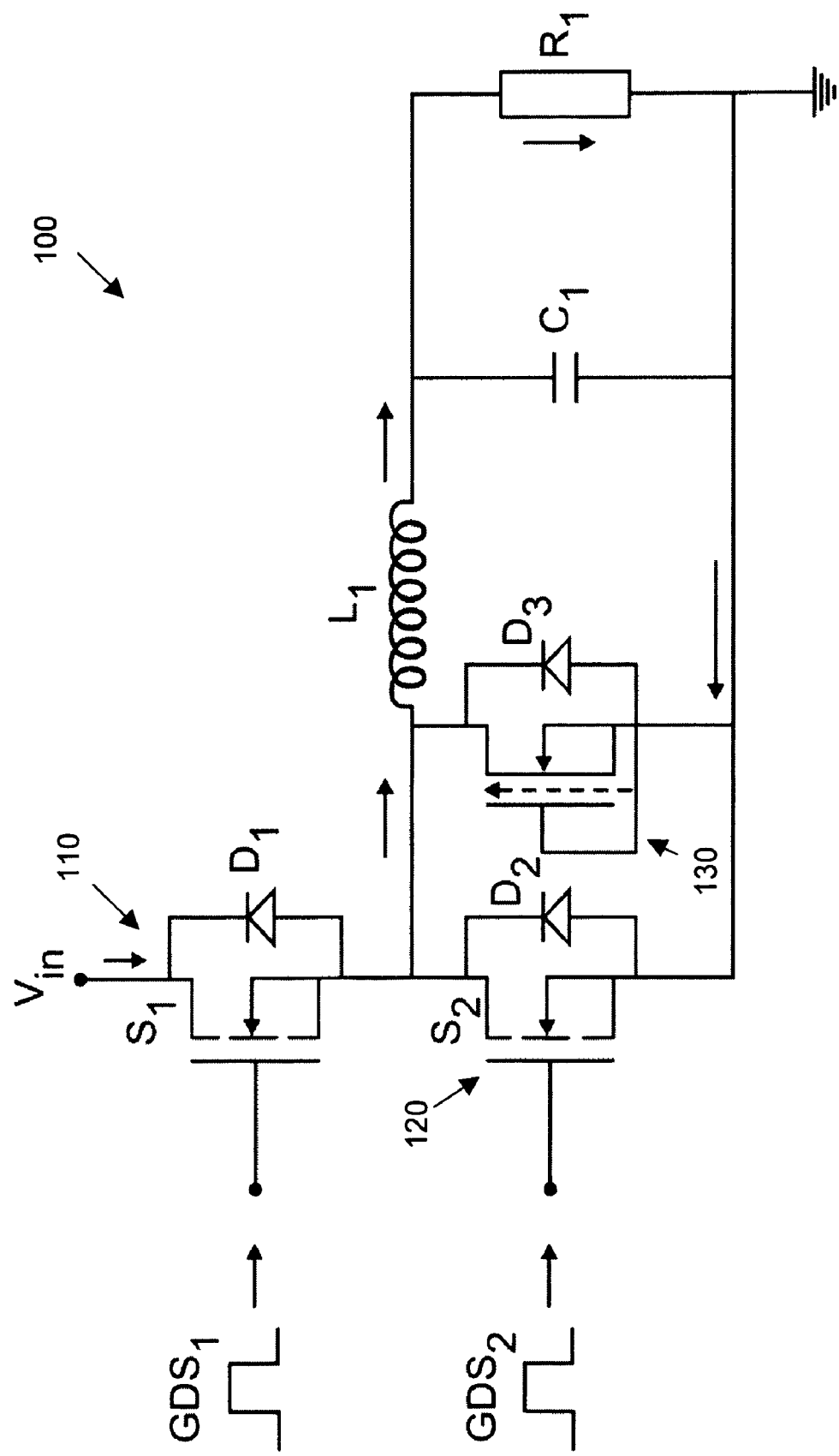
FIG. 2 is a circuit diagram for showing an improved DC/DC converter with the low-side implemented with an enhancement mode MOSFET combined with a depletion mode trench MOSFET of this invention.

Referring to FIG. 2 for a circuit diagram of a DC-to-DC converter 100 of this invention that implements an enhancement mode MOSFET 110, i.e., S1, for the high side connected to the input electrode Vin with a built-in diode D1. The DC-to-DC converter 110 further includes an enhancement mode trench MOSFET 120, i.e., S2 with a built-in diode D2, for the low side. The low-side enhancement mode MOSFET 120 is shunted with a depletion mode trench MOSFET 130 having a built diode D3 and a gate shorted to the source of the low-side enhancement mode MOSFET 120. The converter 100 as shown in FIG. 2 has improved operation efficiency because the current transmitting in the converter 100 within the time between T2 and T3 passes through the channel region of the depletion mode trench MOSFET instead of the built-in diode D2. The voltage drop within the time period between T2 and T3 is therefore significantly reduced and the recovery time is greatly shortened since the built-in diode D2 is not turned on. Furthermore, the reverse current as that shown in FIG. 1D in an enhancement mode MOSFET device is also reduced. Since the enhancement mode and the depletion mode MOSFET devices as shown can be manufactured with compatible manufacturing processes. The enhancement mode MOSFET and the depletion mode MOSFET can be conveniently integrated together as will be further described below in FIG. 7.

Figure 3:
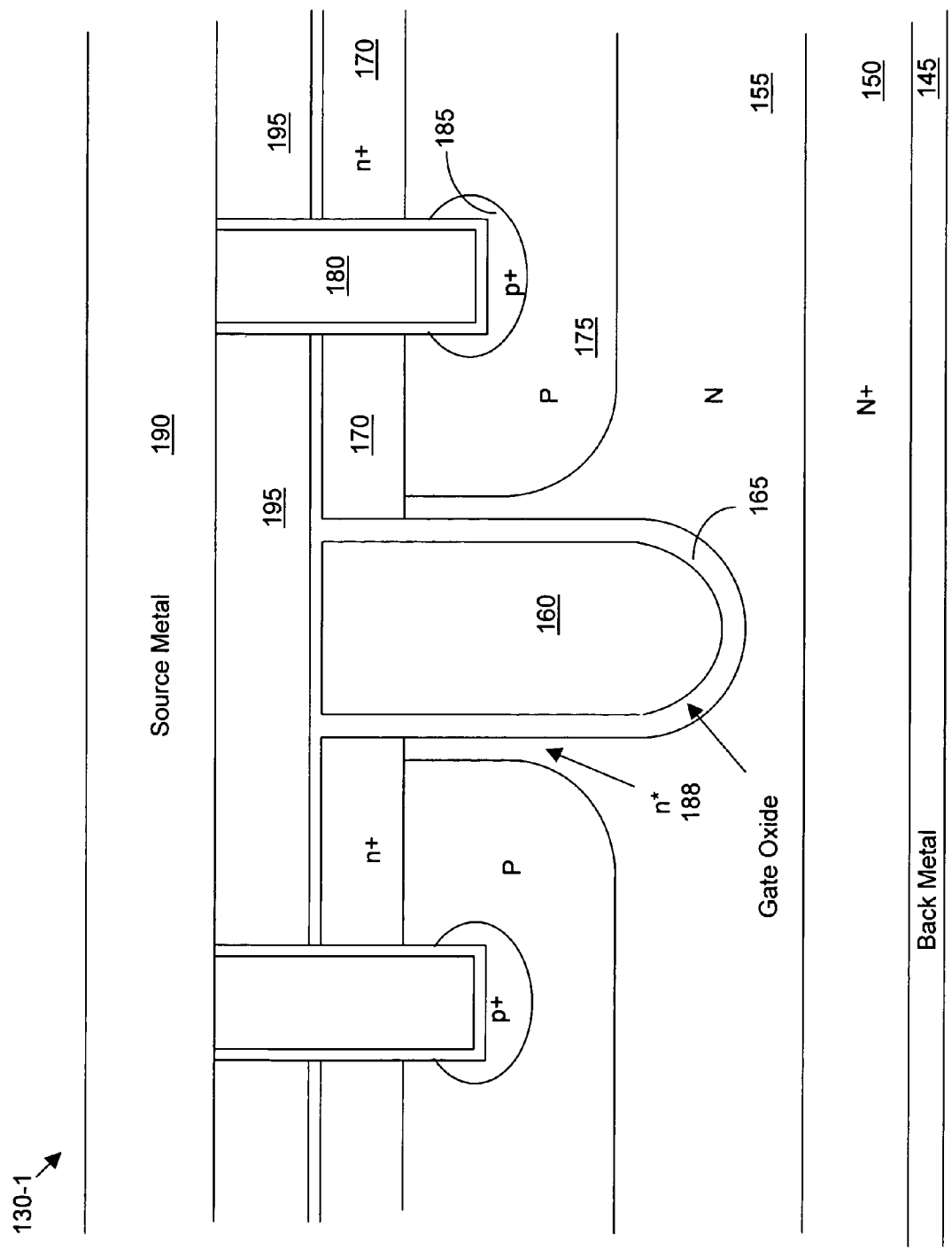
FIGS. 3 to 6 are cross sectional views for showing four alternate depletion mode MOSFET devices as alternate embodiments of the present invention.

FIG. 3 is a cross sectional view for showing the cell configuration of a first exemplary embodiment of a trench gate MOSFET device 130-1 of this invention. The MOSFET device 130-1 is implemented with N-type depletion mode channel region 188 formed by As ion implant. The MOSFET device 130-1 with the N-type depletion mode channel region 188 is formed in a N+ substrate 150 having a back metal layer 145 serving as a bottom drain electrode and supporting a N-type epitaxial layer 155 thereon. The trench MOSFET device 130-1 includes trenched gates 160 disposed in trenches padded by gate oxide layer 165 opened in the epitaxial layer 155. The MOSFET device 130-1 further includes N+ source regions 170 surrounded the trenched gates 160 with the P-body regions 175 disposed in the epitaxial layer 155 below the source regions 170. The MOSFET device 130-1 further includes a plurality of source/body trench contact 180 opened through the insulation layer 195 with metal contact 180 extended into the body regions 175 to contact the body contact doped regions 185 and contacting the source metal layer 190 covering over the top surface. The MOSFET device 130-1 has special N-doped depletion mode channel regions 188 right around the trench gate 160 formed by special arsenic ion (As) implant. The MOSFET 130-1 as shown has free charge carries in the channel when the gate-source voltage is zero. A reverse gate-source voltage is applied to deplete the channel of the free carriers. The MOSFET device 130-1 reduces the current flow by increasing the negative voltage on the gate.

Figure 4:
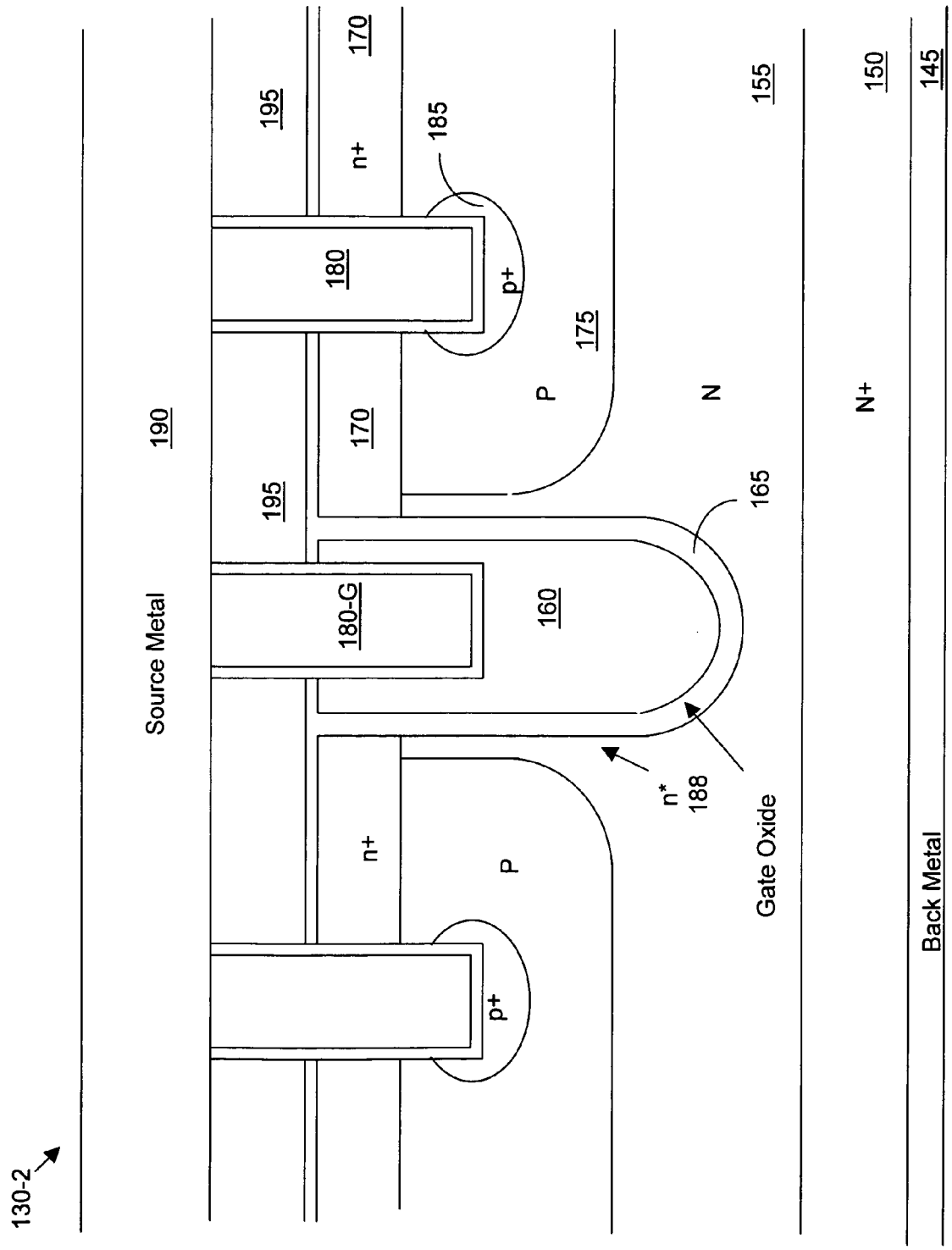

FIG. 4 is a cross sectional view for showing the cell configuration of a second exemplary embodiment of a trench gate MOSFET device 130-2 of this invention. The MOSFET device 130-2 is implemented with N-type depletion mode channel region 188 formed by As ion implant. The MOSFET device 130-2 with the N-type depletion mode channel region 188 is formed in a N+ substrate 150 having a back metal layer 145 serving as a bottom drain electrode and supporting a N-type epitaxial layer 155 thereon. The trench MOSFET device 130-2 includes trenched gates 160 disposed in trenches padded by gate oxide layer 165 opened in the epitaxial layer 155. The MOSFET device 130-2 further includes N+ source regions 170 surrounded the trenched gates 160 with the P-body regions 175 disposed in the epitaxial layer 155 below the source regions 170. The MOSFET device 130-2 further includes a plurality of source/body trench contact 180 opened through the insulation layer 195 with metal contact 180 extended into the body regions 175 to contact the body contact doped regions 185 and contacting the source metal layer 190 covering over the top surface. The MOSFET device 130-2 further includes a plurality of gate-to-source contact 180-G opened through the insulation layer 195 with metal contact 180-G extended into the gate 160 to short the gate 160 to the source metal layer 190 covering over the top surface. The MOSFET device 130-2 has special N-doped depletion mode channel regions 188 right around the trench gate 160 formed by special As ion implant.

Figure 5:
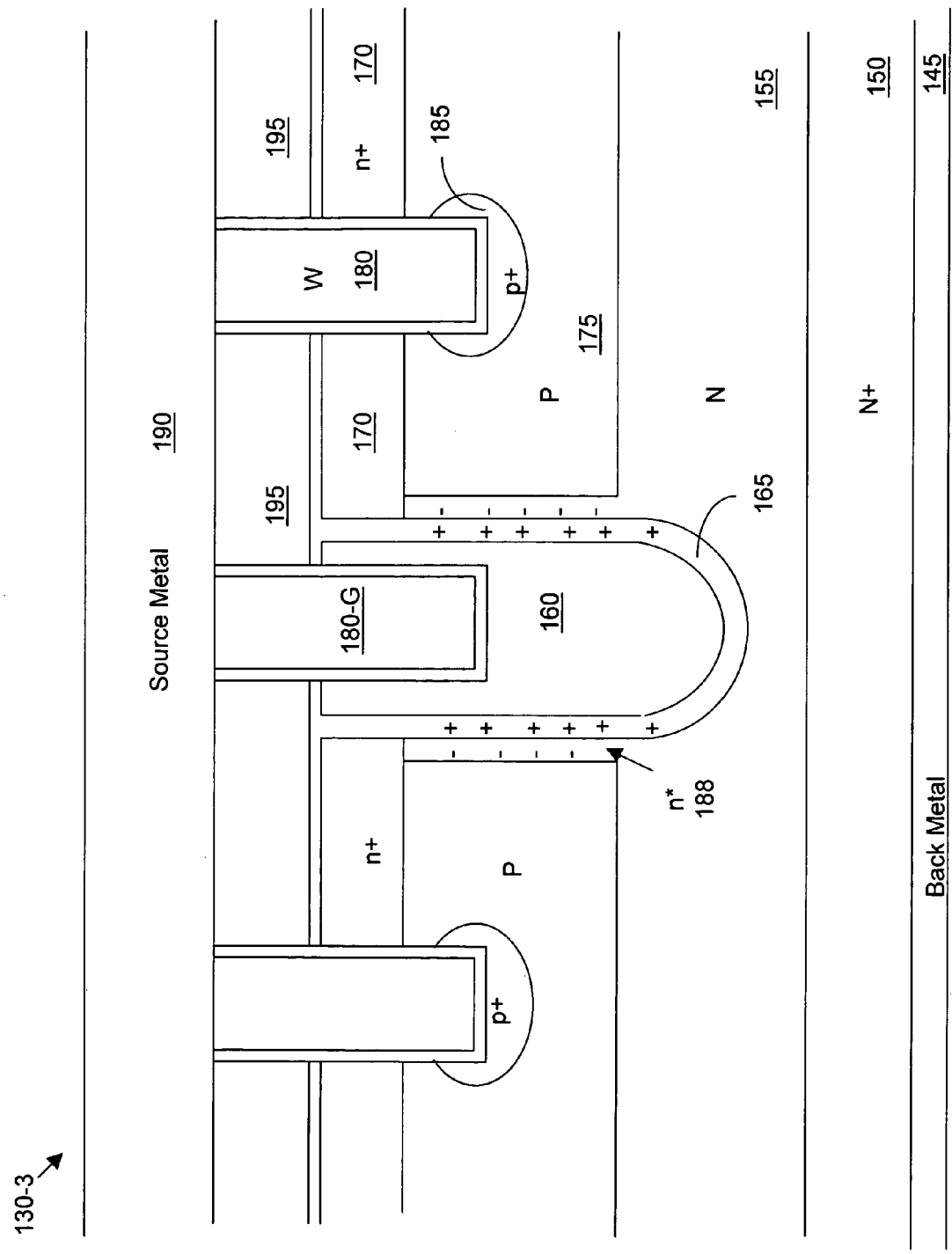

FIG. 5 is a cross sectional view for showing the cell configuration of a third exemplary embodiment of a trench gate MOSFET device 130-3 of this invention. The MOSFET device 130-3 is implemented with N-type depletion mode channel region 188' formed by cesium ion implant. The MOSFET device 130-3 with the N-type depletion mode channel region 188' is formed in a N+ substrate 150 having a back metal layer 145 serving as a bottom drain electrode and supporting a N-type epitaxial layer 155 thereon. The trench MOSFET device 130-3 includes trenched gates 160 disposed in trenches padded by gate oxide layer 165 opened in the epitaxial layer 155. The MOSFET device 130-3 further includes N+ source regions 170 surrounded the trenched gates 160 with the P-body regions 175 disposed in the epitaxial layer 155 below the source regions 170. The MOSFET device 130-3 further includes a plurality of source/body trench contact 180 opened through the insulation layer 195 with metal contact 180 extended into the body regions 175 to contact the body contact doped regions 185 and contacting the source metal layer 190 covering over the top surface. The MOSFET device 130-3 further includes a plurality of gate-to-source contact 180-G opened through the insulation layer 195 with metal contact 180-G extended into the gate 160 to short the gate 160 to the source metal layer 190 covering over the top surface. The MOSFET device 130-3 has special N-doped depletion mode channel regions 188' right around the trench gate 160 formed by special cesium ion implant.

Figure 6:
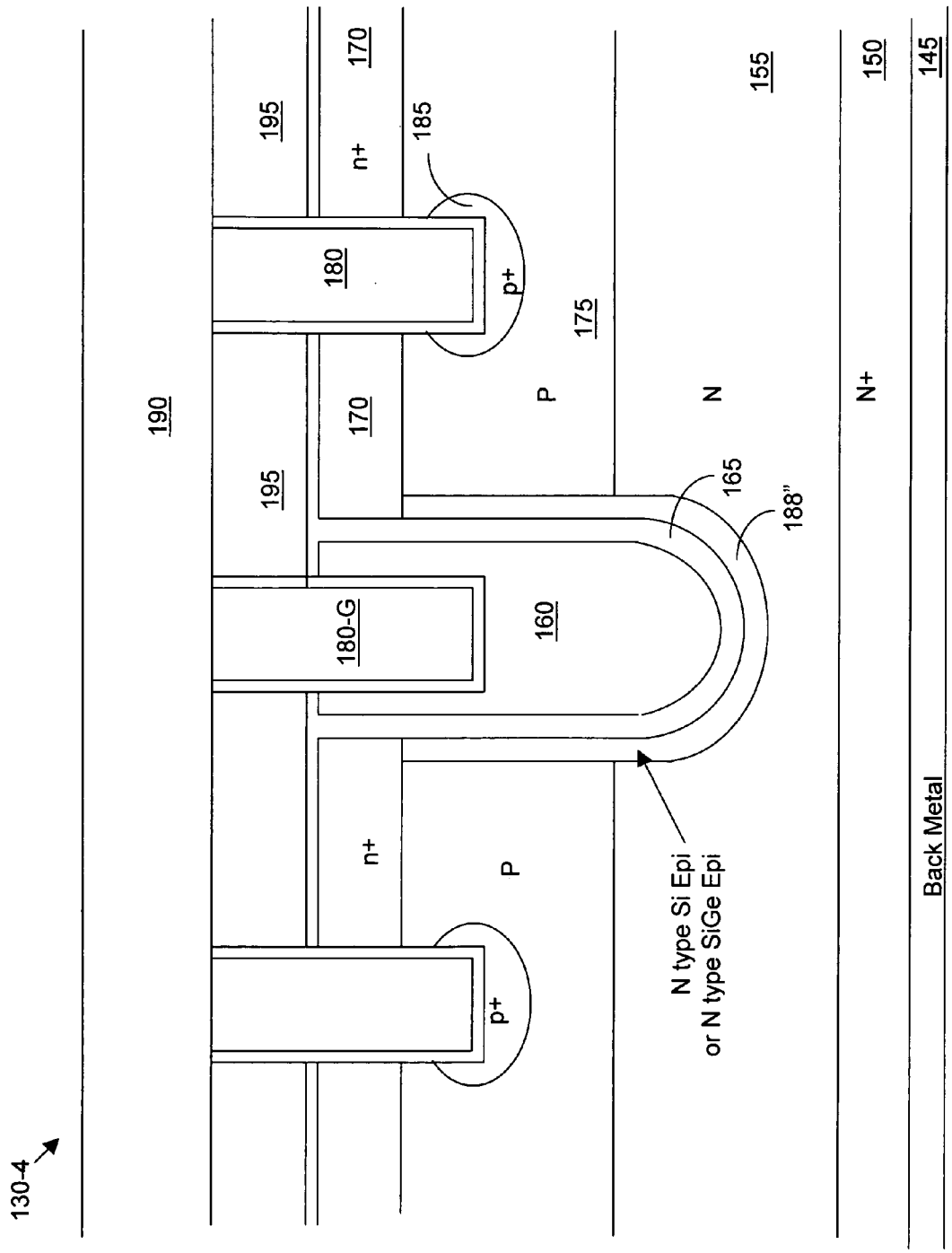

FIG. 6 is a cross sectional view for showing the cell configuration of a fourth exemplary embodiment of a trench gate MOSFET device 130-4 of this invention. The MOSFET device 130-4 is implemented with N-type depletion mode channel region 188" formed by growing N-type silicon or SiGe epitaxial layer 188" having a thickness about ten nanometers or smaller. The MOSFET device 130-4 with the N-type depletion mode channel region 188" is formed in a N+ substrate 150 having a back metal layer 145 serving as a bottom drain electrode and supporting a N-type epitaxial layer 155 thereon. The trench MOSFET device 130-4 includes trenched gates 160 disposed in trenches padded by gate oxide layer 165 opened in the epitaxial layer 155. The MOSFET device 130-4 further includes N+ source regions 170 surrounded the trenched gates 160 with the P-body regions 175 disposed in the epitaxial layer 155 below the source regions 170. The MOSFET device 130-4 further includes a plurality of source/body trench contact 180 opened through the insulation layer 195 with metal contact 180 extended into the body regions 175 to contact the body contact doped regions 185 and contacting the source metal layer 190 covering over the top surface. The MOSFET device 1304 further includes a plurality of gate-to-source contact 180-G opened through the insulation layer 195 with metal contact 180-G extended into the gate 160 to short the gate 160 to the source metal layer 190 covering over the top surface. The MOSFET device 130-4 has special N-type depletion mode channel regions 188" right around the trench gate 160 formed by growing N-type silicon or SiGe epitaxial layer 188" surrounding the trenched gate 160.

Figure 7:
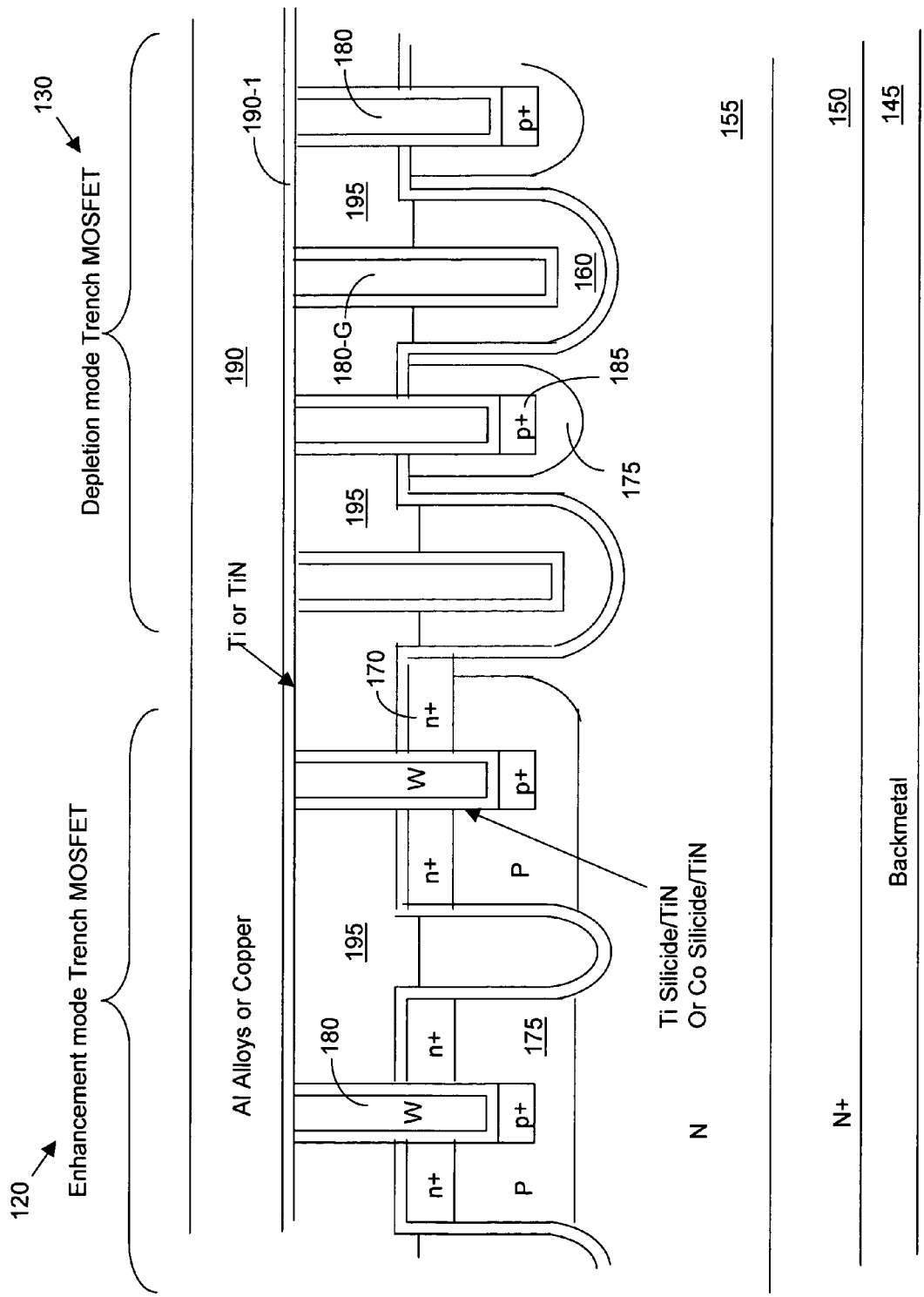
FIG. 7 is a cross sectional view for showing a combined enhancement mode MOSFET with a depletion mode MOSFET device of this invention as that implemented in the DC/DC converter of FIG. 2.

FIG. 7 is a cross sectional view for showing the cell configuration of an exemplary embodiment of an integrated device that integrates the enhancement mode MOSFET device 120 with depletion trench gate MOSFET device 130 of this invention. In this integrated device, the depletion mode MOSFET device 130 is implemented with N-type depletion mode channel region 188. The integrated device with the depletion mode MOSFET 130 and the enhancement mode MOSFET 120 are formed in a N+ substrate 150 having a back metal layer 145 serving as a bottom drain electrode and supporting a N-type epitaxial layer 155 thereon. The MOSFET devices 120 and 130 each includes trenched gates 160 disposed in trenches padded by gate oxide layer 165 opened in the epitaxial layer 155. The MOSFET devices 120 and 130 each further includes N+ source regions 170 surrounded the trenched gates 160 with the P-body regions 175 disposed in the epitaxial layer 155 below the source regions 170. The MOSFET devices 120 and 130 each further includes a plurality of source/body trench contact 180 opened through the insulation layer 195 with metal contact 180 extended into the body regions 175 to contact the body contact doped regions 185 and contacting the source metal layer 190 covering over the top surface. The MOSFET devices 120 and 130 each further includes a plurality of gate-to-source contact 180-G opened through the insulation layer 195 with metal contact 180-G extended into the gate 160 to short the gate 160 to the source metal layer 190 covering over the top surface. The trench source/body contact 180 and the trench gate contact 180-G for shorting the gate to the source metal layer 190 may be trenches filled with tungsten plug wrapped with a barrier layer composed of Ti silicide/TiN, or cobalt silicide/TiN. The depletion mode MOSFET device 120 has special N-type depletion mode channel regions 188 right around the trench gate 160 formed by different processes according to the exemplary embodiments as shown in FIGS. 3 to 6. The source metal layer 190 shown in FIG. 7 may be composed of aluminum alloy or copper covering a resistance reduction layer 190-1 composed of Ti or Ti/TiN in contact with the source/ body contact 180 and the gate contact 180-G respectively disposed in the contact trenches with tungsten contact plugs filled in the contact trenches.

Figure 8A:
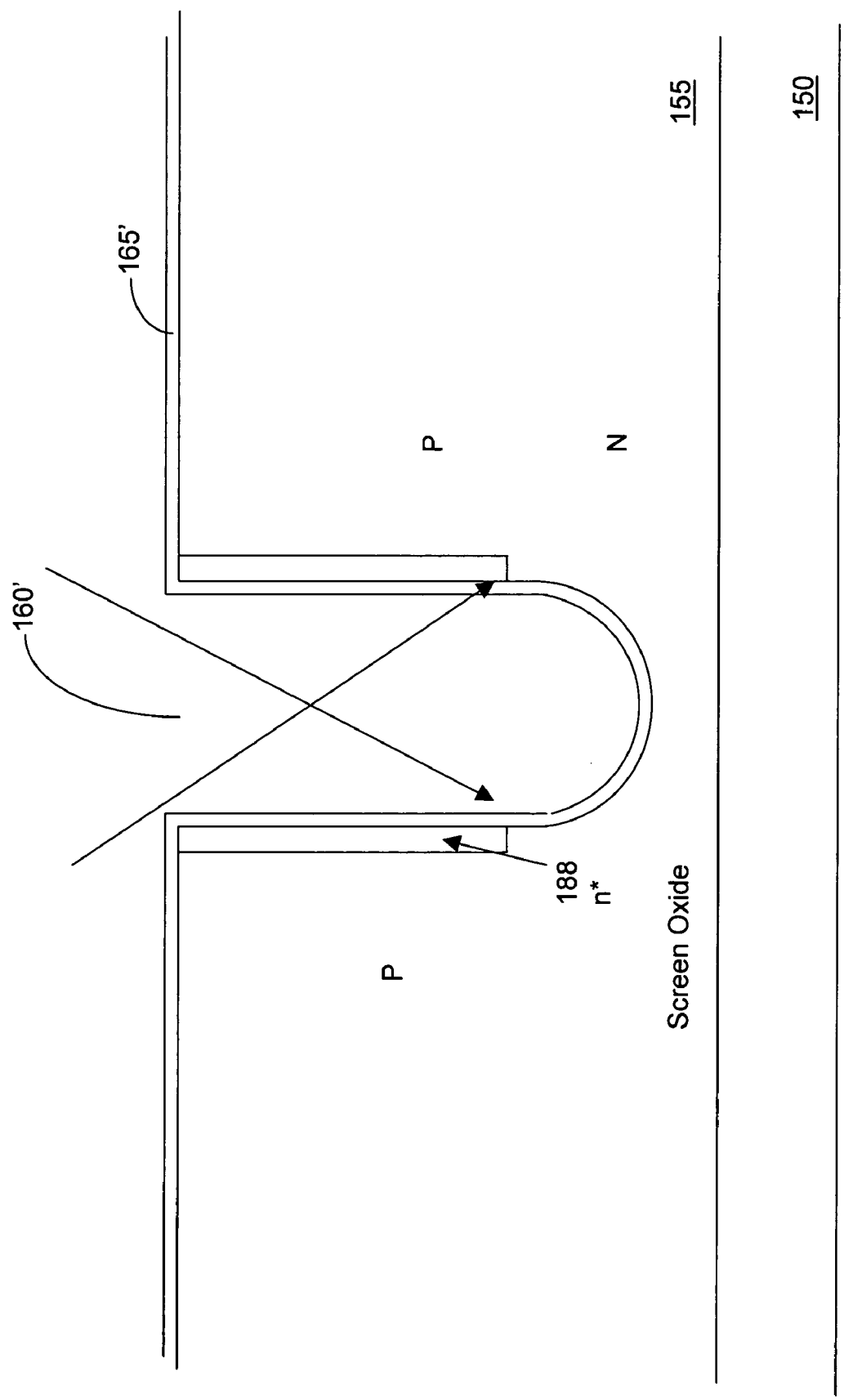
Figures 2, 8A:
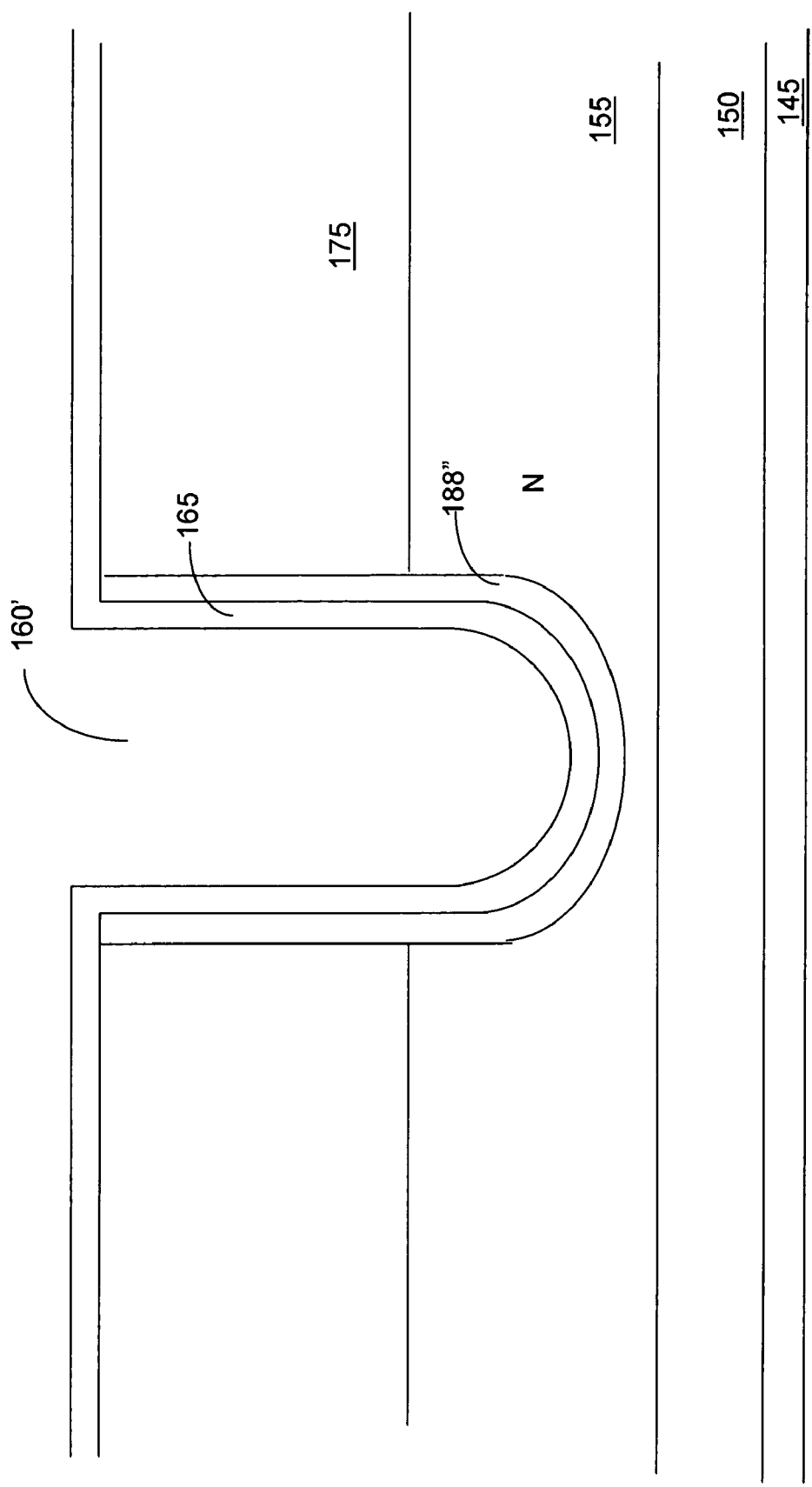
Figure 8B:
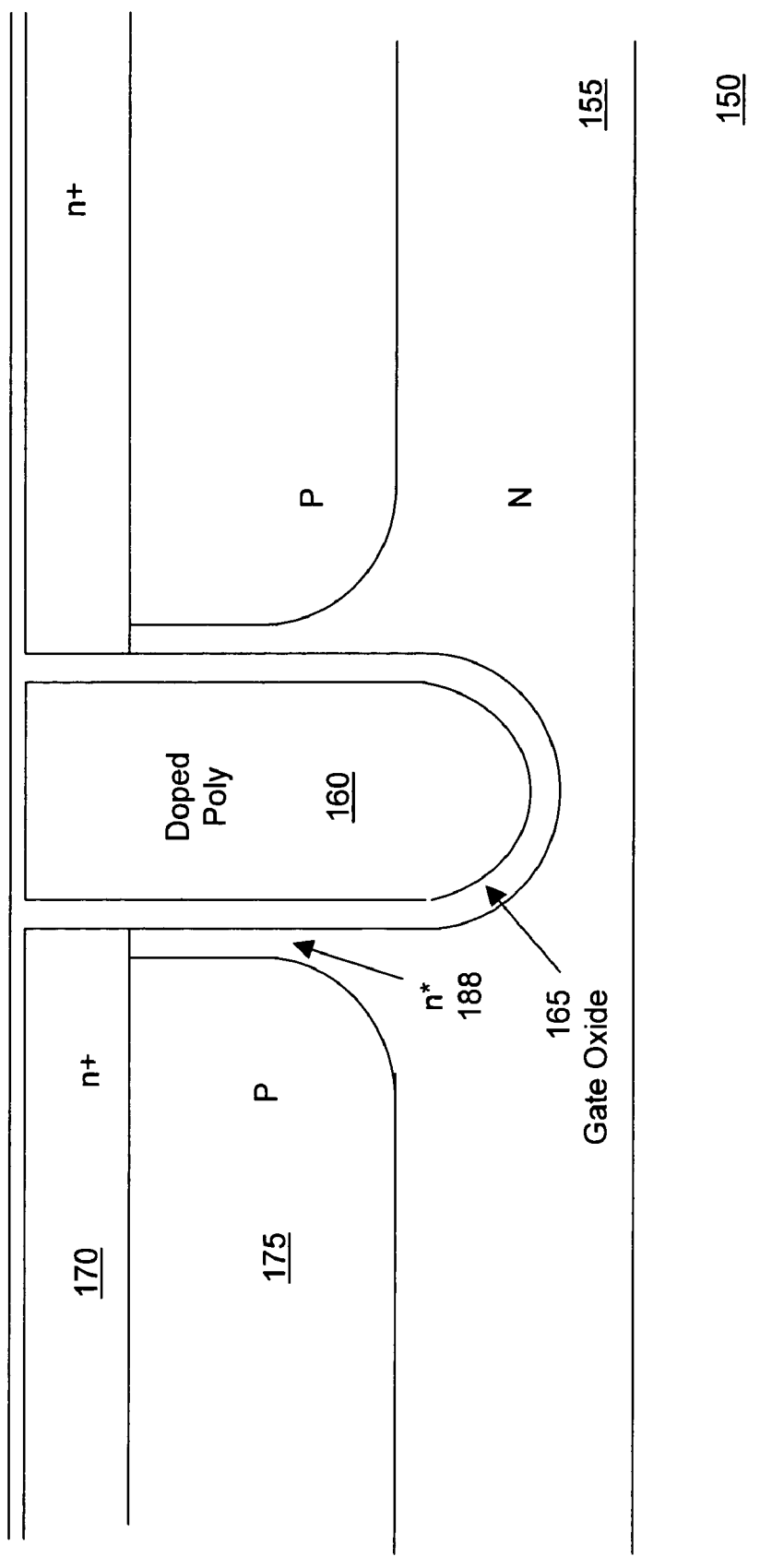
Figures 2, 8B:
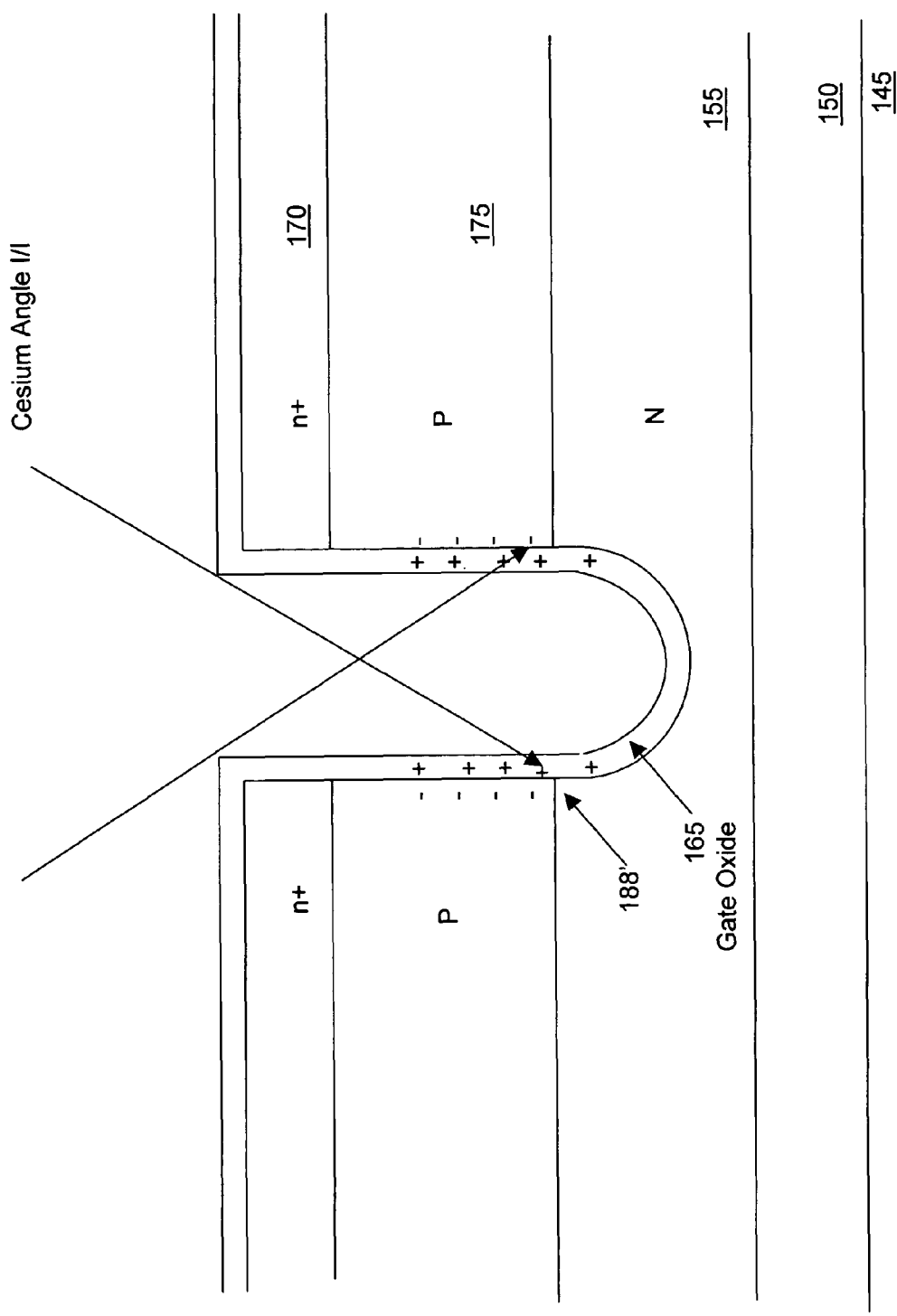
Figure 8C:
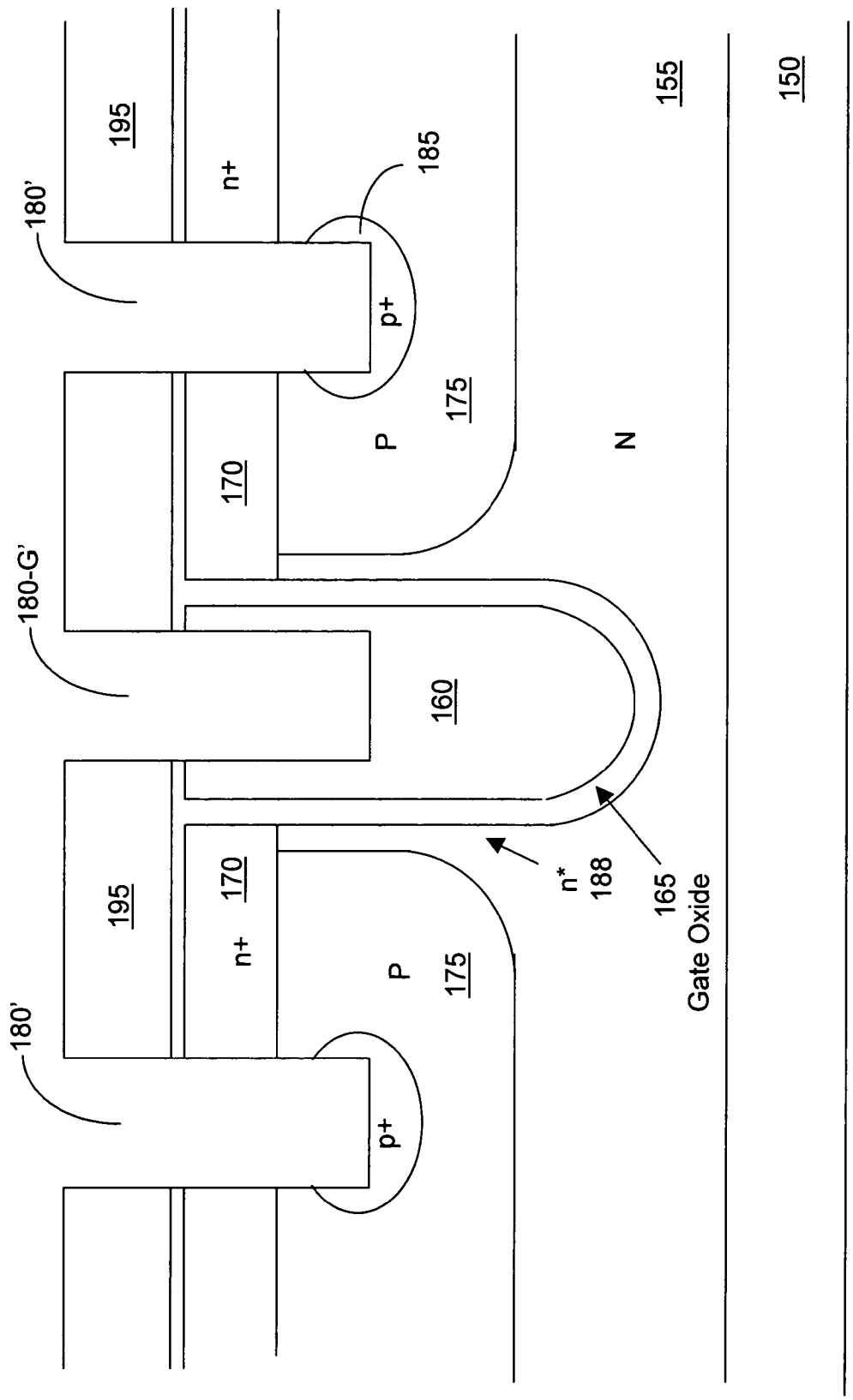
Figure 8D:
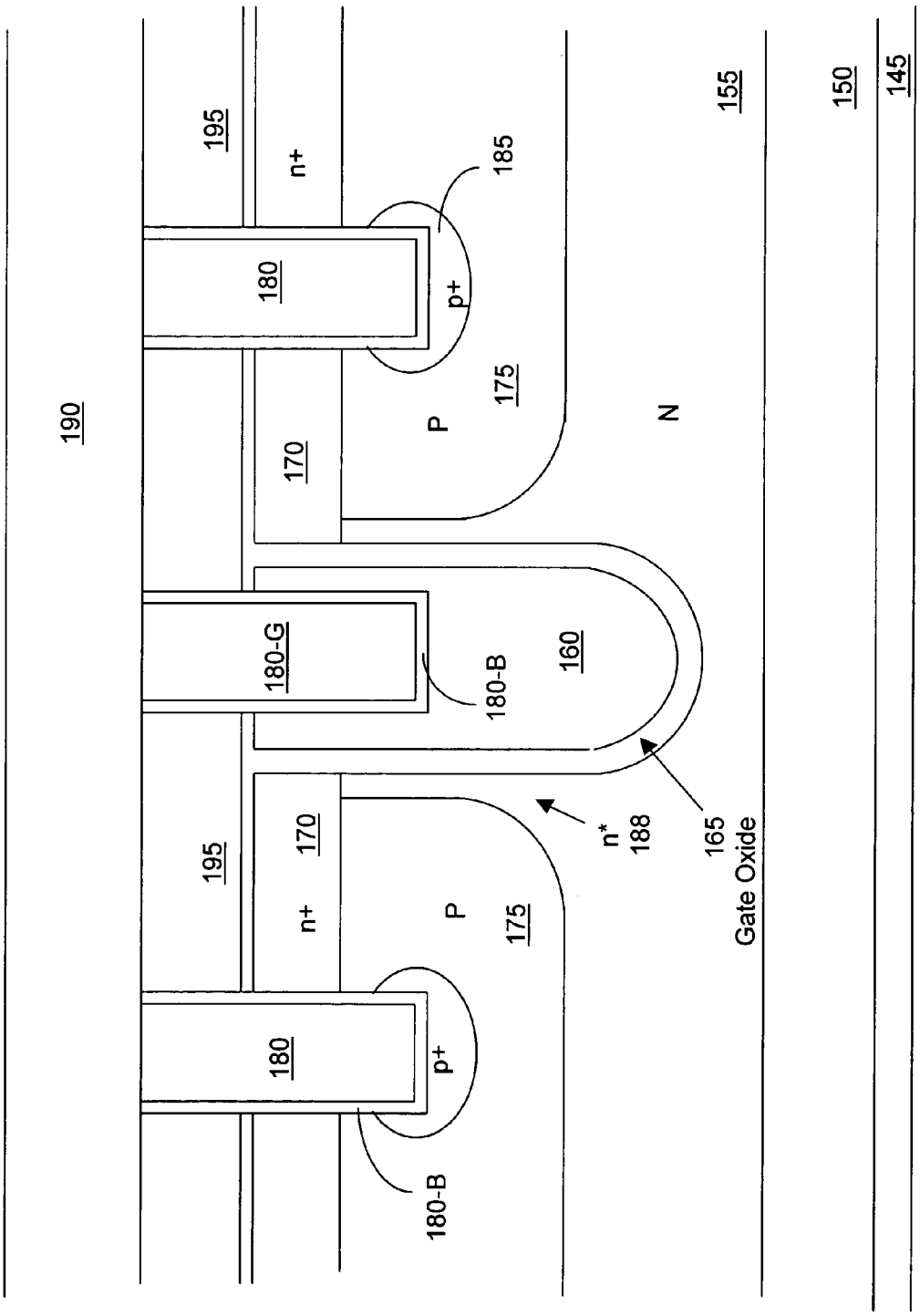

FIGS. 8A to 8D are a series of cross sectional views for illustrating the processing steps for making the depletion mode MOSFET device 130-1 of FIG. 3. In FIG. 8A, the process begins with an etch process to open the trenches 160' in the epitaxial layer 155 supported on a N-type substrate 150. The manufacturing process proceeds with a step of forming a sacrificial oxide layer then removing the sacrificial oxide layer to repair the damaged trench surfaces occurs in the trench etching processes. An oxide screen layer 165' is grown followed by angular ion arsenic implant to form the N+ doped channel regions surrounding the trenches 160'. In FIG. 8B, the oxide screen layer 165' is removed followed by growing a gate oxide layer 165. Then the process continues with the deposition of the doped polysilicon 160 into the trenches 160' to form the trench gates 160. The processes proceed with a body dopant implant and follows with a body dopant diffusion process to form the body regions 175. Then a source dopant ion implant is carried out followed with a drive in process to form the source regions 170 above the body regions 175 with the N* doped region surrounding the trench gates 160 as the depletion mode channel regions 188. In FIG. 8C, an oxide insulation layer 195 is deposited. With a contact mask (not shown), an contact trench etching process is carried out by first applying a dry oxide etch followed by a dry silicon etch to open the source/body contract trenches 180' and the gate/source contact trenches 180-G'. Then, a BF2 ion implant is performed through the contact trenches 180' to form the source/body contact dopant region 185 below the bottom surface of the source/body contact trenches 180'. In FIG. 8D, a Ti/TiN or Co/TiN deposition is carried out to form the barrier layer 180-B surrounding the bottom surface and sidewalls of the source/body contact trenches 180' and gate-source contact trenches 180-G'. A tungsten deposition process is carried out to fill the contact trenches 180' and 180-G' with contact plugs 180 and 180-G. A tungsten and Ti/TiN or Co/Ti/N etch back process is carried out to remove the tungsten and the Ti/TiN or Co/TiN from above the contact trenches. The manufacturing process is completed with the deposition and the formation of the source metal layer 190 with an aluminum alloy or Ti/Ni/Ag deposition and the back metal process to form the drain electrode 145 at bottom surface of the substrate 150.

Referring to FIG. 8B-2 for a process to form an alternate embodiment of the depletion mode MOSFET device 130-3 as shown in FIG. 5. A cesium ion implant is carried out with a tilt angle relative to the trench sidewalls of the gate trenches 160' after the gate oxide layer 165 is formed. A depletion mode channel 188' is therefore formed surrounding the gate trenches 160'. All other processing steps are the same as that described in FIGS. 8A to 8D above to form the MOSFET device 130-3 with depletion mode channel region.

Referring to FIG. 8A-2 for a processing step particularly applied to form an exemplary embodiment shown in FIG. 6 as the MOSFET device with depletion mode channel regions near the gates formed as Si epitaxial layer or as a Si_strain SiGe layer 188". The process starts after the oxide sacrificial layer is removed by depositing a N-type Si or deposition of a combination of N-type silicon layer followed by N-type SiGe deposition that has above 50% higher mobility than silicon. It is noted that N-type silicon is consumed when the gate oxide layer is grown later because the gate oxide layer is grown directly on the SiGe layer and has poor interface state between the gate oxide and the SiGe layer. After the deposition of the SiGe layer formed as the depletion mode channel region surrounding the gate trenches 160', a gate oxide layer 165 is grown. The other processing steps to manufacture the MOSFET 130-4 with depletion mode channel region formed with the SiGe layer is the same as that shown in FIGS. 8B to 8D.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A DC-to-DC converter comprising a high-side transistor and a low-side transistor wherein said high-side transistor is implemented with a high-side enhancement mode MOSFET and said low-side transistor further comprising:
   a low-side enhancement mode MOSFET shunted with a depletion mode MOSFET wherein said low-side enhancement mode MOSFET and said depletion mode MOSFET having a common source and a common drain, wherein said depletion mode MOSFET having a gate shorted to said common source.

2. The DC-to-DC converter of claim 1 wherein:
   a current transmitting in said DC-to-DC converter within a time-period between T2 and T3 passes through a channel region of said depletion mode MOSFET instead of a built-in diode D2 of the low-side enhancement MOSFET.

3. The DC-to-DC converter of claim 1 wherein:
   the depletion mode MOSFET is integrated with said low-side enhancement mode MOSFET and said high-side enhancement mode MOSFET transistor are manufactured simultaneously with compatible manufacturing processes.

4. The DC-to-DC converter of claim 1 wherein:
   the depletion mode MOSFET integrated with said low-side enhancement mode MOSFET and said nigh-side enhancement mode MOSFET are manufactured simultaneously with compatible manufacturing processes and disposed on one semiconductor substrate for packaging as an integrated circuit (IC) chip.

5. The DC-to-DC converter of claim 1 wherein:
   the depletion mode-MOSFET further comprising trench gates surrounded by body regions with channel regions immediately adjacent to vertical sidewalls of said trench gates wherein said channel regions formed as depletion mode channel regions by dopant ions having electrical conductivity type opposite from a conductivity type of said body regions.

6. The DC-to-DC converter of claim 1 wherein:
   the depletion mode MOSFET further comprising trench gates surrounded by body regions of P-type conductivity having channel regions immediately adjacent to vertical sidewalls of said trench gates wherein said channel regions formed as depletion mode channel regions by dopant ions having a N-type conductivity.

7. The DC-to-DC converter of claim 1 wherein:
   the depletion mode MOSFET further comprising trench gates surrounded by body regions of P-type conductivity having channel regions immediately adjacent to vertical sidewalls of said trench gates wherein said channel regions are depletion mode channel regions implanted with arsenic (As) dopant ions.

8. The DC-to-DC converter of claim 1 wherein:
the depletion mode MOSFET further comprising trench gates surrounded by body regions of P-type conductivity having channel regions immediately adjacent to vertical sidewalls of said trench gates wherein said channel regions are depletion mode channel regions implanted with Cesium (Cs) dopant ions.

9. The DC-to-DC converter of claim 1 wherein:
the depletion mode MOSFET further comprising trench gates surrounded by body regions of P-type conductivity having channel regions immediately adjacent to vertical sidewalls of said trench gates wherein said channel regions are depletion mode channel regions N-type silicon epitaxial layer surrounding said trench gates.

10. The DC-to-DC converter of claim 1 wherein:
the depletion mode MOSFET further comprising trench gates surrounded by body regions of P-type conductivity having channel regions immediately adjacent to vertical sidewalls of said trench gates wherein said channel regions are depletion mode channel regions N-type SiGe epitaxial layer surrounding said trench gates.

11. The DC-to-DC converter of claim 1 wherein:
the depletion mode MOSFET further comprising trench gates surrounded by body regions with channel regions immediately adjacent to vertical sidewalls of said trench gates wherein said channel regions are formed as depletion mode channel regions doped with dopant ions having electrical conductivity type opposite from a conductivity type of said body regions; and
said trench gates are electrically shorted to source regions of said depletion mode MOSFET via a gate contact metal contacting to a source metal of said low-side depletion mode MOSFET.

12. A depletion mode MOSFET manufactured simultaneously side-by-side on a semiconductor substrate with an enhancement mode MOSFET wherein:
said depletion mode MOSFET having a gate contact trench opened through an insulation layer filled with a metal contact plug extend to a gate of said depletion mode MOSFET and in contact with a source metal layer on top of said insulation layer in electrical contact and shorted to a source regions of said enhancement MOSFET and said depletion mode MOSFET.

13. The depletion mode MOSFET of claim 12 wherein:
the depletion mode MOSFET and said enhancement mode MOSFET comprising trench gates surrounded by said source regions encompassed in body regions extended between said trench gates wherein said trench gates, and said source and said body regions disposed side-by-side on the semiconductor substrate are simultaneously manufactured and integrated on a single chip for packaging as an integrated circuit (IC) chip.

14. The depletion mode MOSFET of claim 12 wherein:
the depletion mode MOSFET further comprising trench gates surrounded by said source regions encompassed in said body regions with channel regions immediately adjacent to vertical sidewalls of said trench gates wherein said channel regions formed as depletion mode channel regions having dopant ions with electrical conductivity type opposite from a conductivity type of said body regions.

15. The depletion mode MOSFET of claim 12 wherein:
the depletion mode MOSFET further comprising trench gates surrounded by an N-type source region encompassed body regions of P-type conductivity having channel regions immediately adjacent to vertical sidewalls of said trench gates wherein said channel regions formed as depletion mode channel regions with dopant ions having a N-type conductivity.

16. The depletion mode MOSFET of claim 12 wherein:
the depletion mode MOSFET further comprising trench gates surrounded by an N-type source region encompassed in body regions of P-type conductivity having channel regions immediately adjacent to vertical sidewalls of said trench gates wherein said channel regions are depletion mode channel regions implanted with arsenic (As) dopant ions.

17. The depletion mode MOSFET of claim 12 wherein:
the depletion mode MOSFET further comprising trench gates surrounded by an N-type source region encompassed in body regions of P-type conductivity having channel regions immediately adjacent to vertical sidewalls of said trench gates wherein said channel regions are depletion mode channel regions implanted with Cesium (Cs) dopant ions.

18. The depletion mode MOSFET of claim 12 wherein:
the depletion mode MOSFET further comprising trench gates surrounded by an N-type source region encompassed in body regions of P-type conductivity having channel regions immediately adjacent to vertical sidewalls of said trench gates wherein said channel regions are depletion mode channel regions each comprises an N-type silicon epitaxial layer surrounding said trench gates.

19. The depletion mode MOSFET of claim 12 wherein:
the depletion mode MOSFET further comprising trench gates surrounded by an N-type source region encompassed in body regions of P-type conductivity having channel regions immediately adjacent to vertical sidewalls of said trench gates wherein said channel regions are depletion mode channel regions each comprises an N-type SiGe epitaxial layer surrounding said trench gates.

20. The depletion mode MOSFET of claim 12 wherein:
the depletion mode MOSFET further comprising trench gates surrounded by the source regions encompassed in body regions with channel regions immediately adjacent to vertical sidewalls of said trench gates wherein said channel regions are formed as depletion mode channel regions by dopant ions having electrical conductivity type opposite from a conductivity type of said body regions and said trench gates are electrically shorted to the source regions of said depletion mode MOSFET via the gate contact metal plug contacting to the source metal layer and through a trenched source/body contact of said depletion mode MOSFET contacting said source metal layer.

* * * * *